United States Patent [19]

Sugiyama

[11] Patent Number: 5,166,686

[45] Date of Patent: Nov. 24, 1992

[54] VARIABLE LENGTH BLOCK CODING WITH CHANGING CHARACTERISTICS OF INPUT SAMPLES

[75] Inventor: Akihiko Sugiyama, Tokyo, Japan

[73] Assignee: NEC Corporation, Japan

[21] Appl. No.: 546,234

[22] Filed: Jun. 29, 1990

[30] Foreign Application Priority Data

Jun. 30, 1989 [JP] Japan .................................. 1-170068
Jun. 30, 1989 [JP] Japan .................................. 1-170069
Sep. 20, 1989 [JP] Japan .................................. 1-245514

[51] Int. Cl.$^5$ ........................ H03M 1/06; H03M 1/12
[52] U.S. Cl. .................................. 341/155; 341/118;
341/141; 341/67
[58] Field of Search .................. 341/155, 118, 141, 67

[56] References Cited

U.S. PATENT DOCUMENTS

| | | | |
|---|---|---|---|
| 3,940,759 | 2/1976 | Zitelli et al. | 341/118 |
| 4,282,515 | 8/1981 | Patterson, III | 341/118 |
| 4,677,422 | 6/1987 | Naito | 341/141 X |
| 4,999,624 | 3/1991 | Pichlik | 341/141 X |

OTHER PUBLICATIONS

R. Zelinski and P. Noll, "Adaptive Transform Coding of Speech Signals", *IEEE Transactions on Acoustics, Speech, and Signal Processing*, vol. ASSP-25, No. 4, Aug. 1977, pp. 299-309.
R. Zelinski and P. Noll, "Approaches to Adaptive Transform Speech Coding at Low Bit Rates", *IEEE Transactions on Acoustics, Speech, and Signal Processing* vol. ASSP-27, No. 1, Feb. 1979, pp. 89-95.

*Primary Examiner*—Sharon D. Logan
*Attorney, Agent, or Firm*—Ostrolenk, Faber, Gerb & Soffen

[57] ABSTRACT

In a communications system, input digital samples are continuously stored into a buffer and successively divided into a group of blocks of different lengths. The samples of each of the blocks are encoded into linear transform coefficients at intervals corresponding to the length of each block and each block of the linear transform coefficients is then decoded into a variable length block of decoded samples. An error between each block of decoded samples and a corresponding block of samples from the buffer is detected, and a plurality of such errors derived from each group of blocks of input samples are stored in memory. A minimum value of the errors in the memory is determined and one of the blocks of the coded symbols which corresponds to the minimum value is identified as having an optimum block length. The linear transform coefficients of the optimum block length are multiplexed with the optimum block length information into a channel for transmission. At the receive end of the system, the transmitted linear transform coefficients are decoded into original signal at intervals corresponding to the multiplexed optimum block length information.

42 Claims, 11 Drawing Sheets

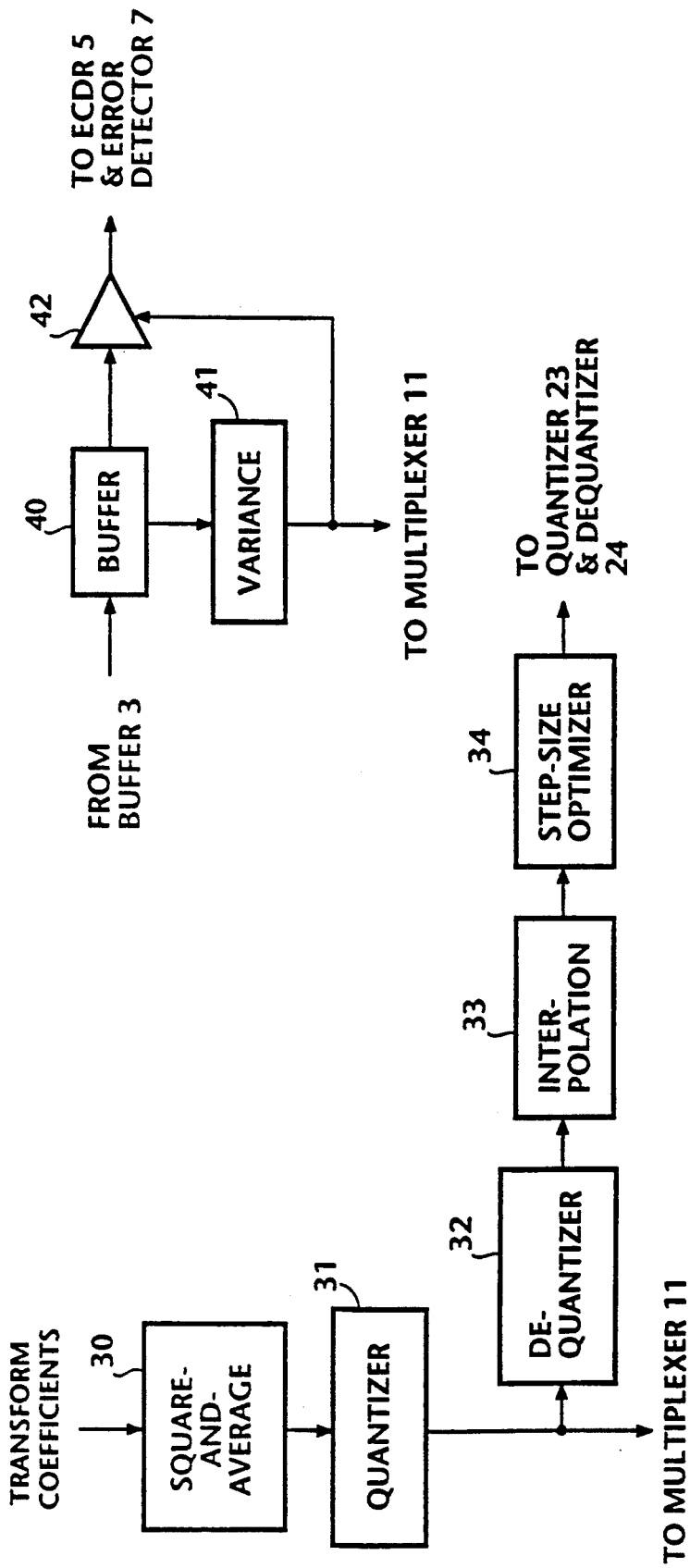

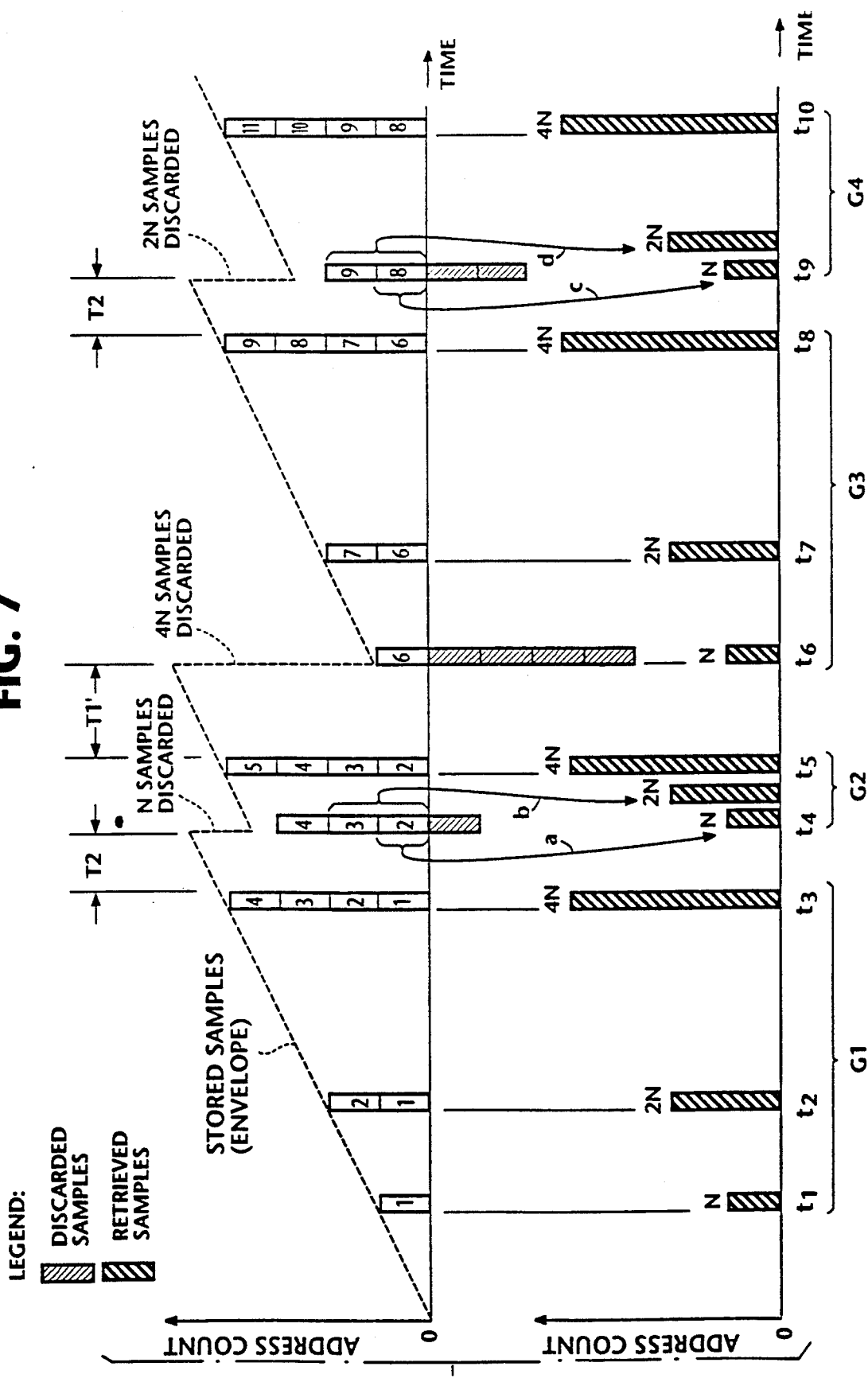

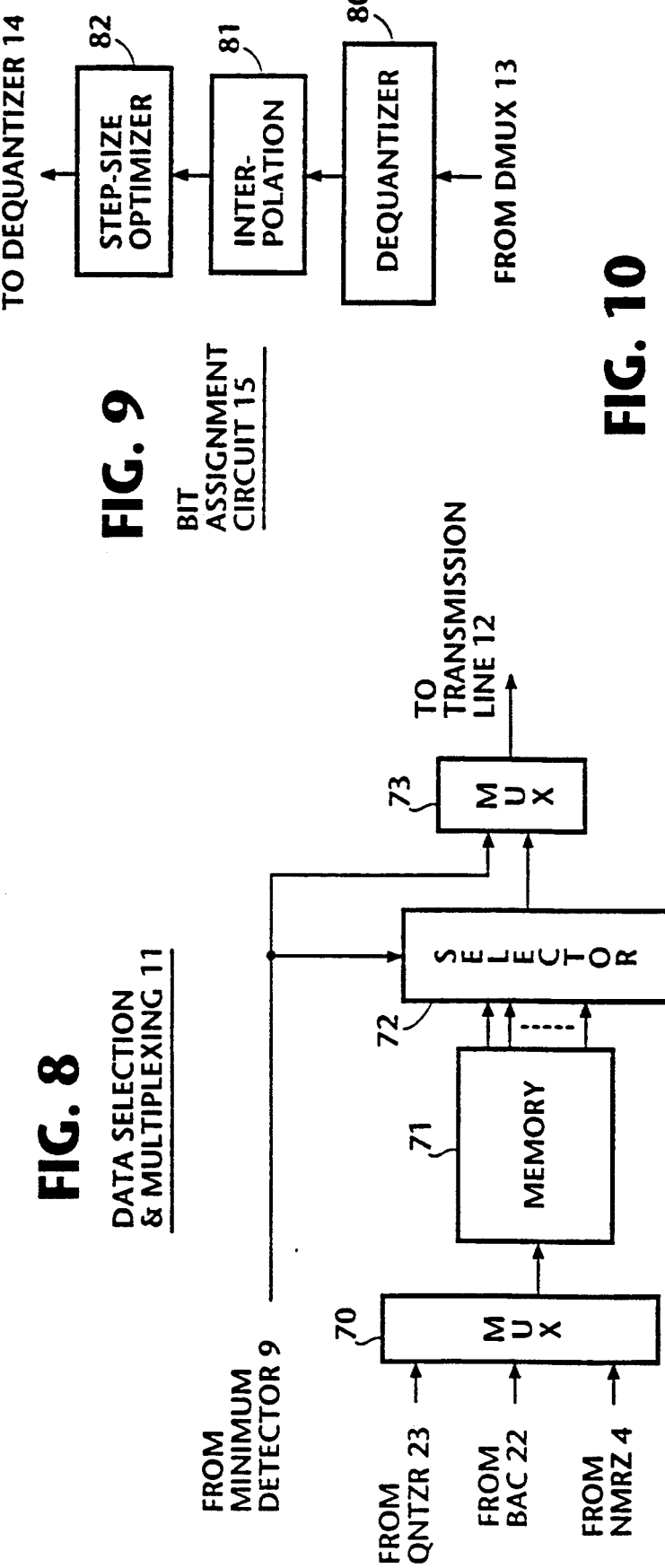

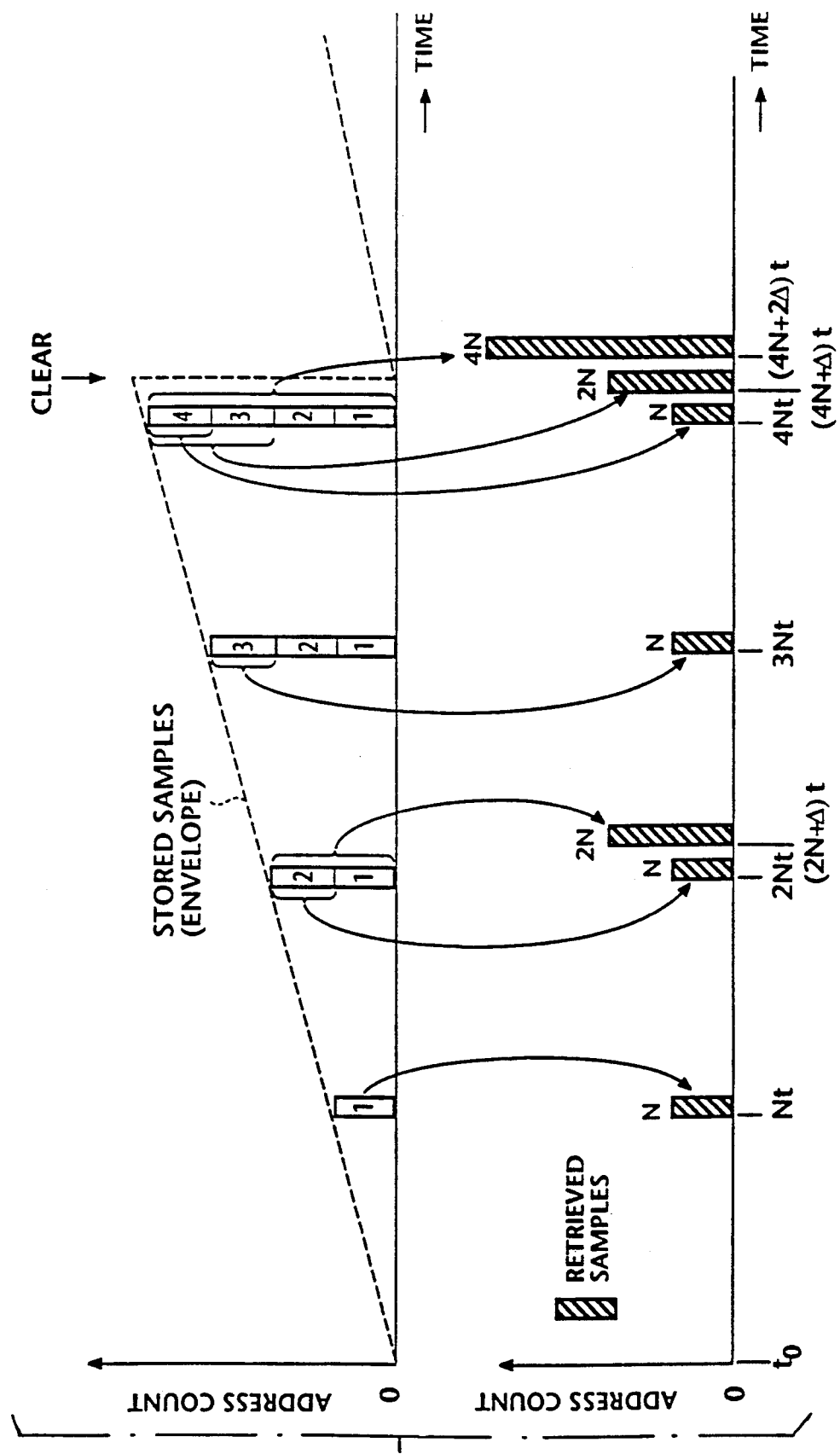

VARIABLE LENGTH BLOCK CODING WITH CHANGING CHARACTERISTICS OF INPUT SAMPLES

BACKGROUND OF THE INVENTION

The present invention relates generally to bandwidth compression techniques for digital audio signal transmission systems, and more particularly to transform coding.

Adaptive differential pulse-code modulation (ADPCM) technique is known as a practical way of bandwidth compression and has been extensively used in digital communications. Another bandwidth compression technique that is attractive for audio frequency signals is adaptive transform coding scheme (ATC). As described in "Adaptive Transform coding of Speech Signals", IEEE Transactions on ASSP, Vol. 25, No. 4, 1977, pages 299–309, and "Approaches to Adaptive Transform Speech Coding at Low Bit Rates", IEEE Transactions on ASSP, Vol. 27, No. 1, 1979, pages 89–95, input discrete speech samples are buffered to form a block of N speech samples each. The N samples of each block are linearly transformed into a group of transform coefficients based on a linear transform. These transform coefficients are then adaptively quantized independently and transmitted. The adaptation is controlled by a short-term basis spectrum that is derived from the transform coefficients prior to quantization and transmission, and that is transmitted as a supplementary signal to the receiver. Specifically, the short-term basis spectrum is obtained by a bit assignment process in which quantization bits are assigned corresponding to the amplitude of the transform coefficients. At the receiver, the quantized signals are adaptively dequantized in response to the supplementary signal, and an inverse transform is taken to obtain the corresponding block of reconstructed speech samples.

With an increasing value of block length N, the linear transform coding and decoding processes have increasing power of resolution with a resultant decrease in errors, and the amount of information contained in the supplementary signal decreases with the increase in block length N. This implies that for a given transmission rate a greater amount of data can be transmitted, and hence, it can lead to the quality improvement of coded signals. This is true for speech samples which can be considered as being steady for an interval corresponding to the block length N. However, with samples having a rapidly changing characteristic such as amplitude, phase and frequency, a larger value of block length does not necessarily result in small errors. Thus, it is desirable that block length N be as large as possible for signals of more stable nature, but as small as possible for signals of less stable nature. These conflicting requirements cannot be accommodated by the prior art uniform block length approach.

SUMMARY OF THE INVENTION

It is therefore an object of the present invention to provide variable length block coding of digital samples representing an underlying audio-frequency analog waveform such as speech and music signals.

According to a broader aspect of this invention, a sequence of input samples representing an audio-frequency signal are continuously stored into a buffer, and a change in characteristics of the input samples of successive groups is successively detected. The input samples of each successive group are formed into one or more blocks of optimum length which is variable in accordance with said detected characteristics change. The samples of each successive block are encoded into coded symbols at intervals corresponding to the length of each successive block. The coded symbols are multiplexed into a channel with a signal representative of the length of each successive block. The multiplexed signal may be recorded into a suitable recording medium or transmitted to a destination. Upon reproduction from the recording medium or upon reception through the channel, the multiplexed signal is decomposed into the coded symbols and the length-representative signal. The coded symbols are decoded at intervals corresponding to the length-representative signal.

According to a first specific aspect of the present invention, the input samples stored into the buffer are successively divided into a group of blocks of different lengths. The samples of each of the blocks are encoded into coded symbols and each block of the coded symbols is then decoded into a block of samples. An error between each block of decoded samples and a corresponding block of samples from the buffer is detected, and a plurality of such errors are derived from each group of blocks of input samples. A minimum value of the errors is then determined and one of the blocks of the coded symbols which corresponds to the minimum error is identified as having an optimum block length. The coded symbols of the optimum block length are multiplexed with a signal indicating the optimum block length into a channel for purposes of either transmission or recording.

According to a second specific aspect, there is provided a communications system which comprises a buffer, a buffer controller for storing audio-frequency digital samples into the buffer and reading the stored samples from the buffer to produce a sequence of blocks of samples of different lengths. An encoder is coupled to the buffer for encoding the samples of each of the blocks into coded symbols and a first decoder is coupled to the encoder for decoding the coded symbols into decoded samples in a process inverse to the encoder. An error detector is coupled to the buffer and to the decoder for detecting an error between each block of the decoded samples and a corresponding block of samples from the buffer. A memory is provided for storing errors detected by the error detector from the sequence of blocks of samples. A minimum detector detects a minimum value of the errors in the memory and generates a signal identifying one of the blocks of the coded symbols which corresponds to the minimum value as having an optimum block length. A multiplexer multiplexes the coded symbols of the optimum block length with the optimum length signal into a channel for transmission from a transmit end of the system. At the receive end, a demultiplexer receives a multiplexed signal through the channel and decomposes the multiplexed signal into the coded symbols and the optimum length signal. A second decoder is coupled to the demultiplexer for decoding the coded symbols at intervals corresponding to the optimum length indicated by the demultiplexed optimum length signal.

BRIEF DESCRIPTION OF THE DRAWINGS

The present invention will be described in further detail with reference to the accompanying drawings, in which:

FIG. 2 is a block diagram of the bit assignment circuit of the transmitter of FIG. 1;

FIG. 3 is a block diagram of the normalizer of FIG. 1;

FIG. 7 is a timing diagram for describing the operation of FIG. 6;

FIG. 8 is a block diagram of the data selection and multiplexing circuit of FIG. 1;

FIG. 9 is a block diagram of the bit assignment circuit of the receiver of FIG. 1;

FIG. 10 is a block diagram of the denormalizer of FIG. 1.

FIG. 13 is a timing diagram associated with FIG. 12; and

DETAILED DESCRIPTION

Figure 1:
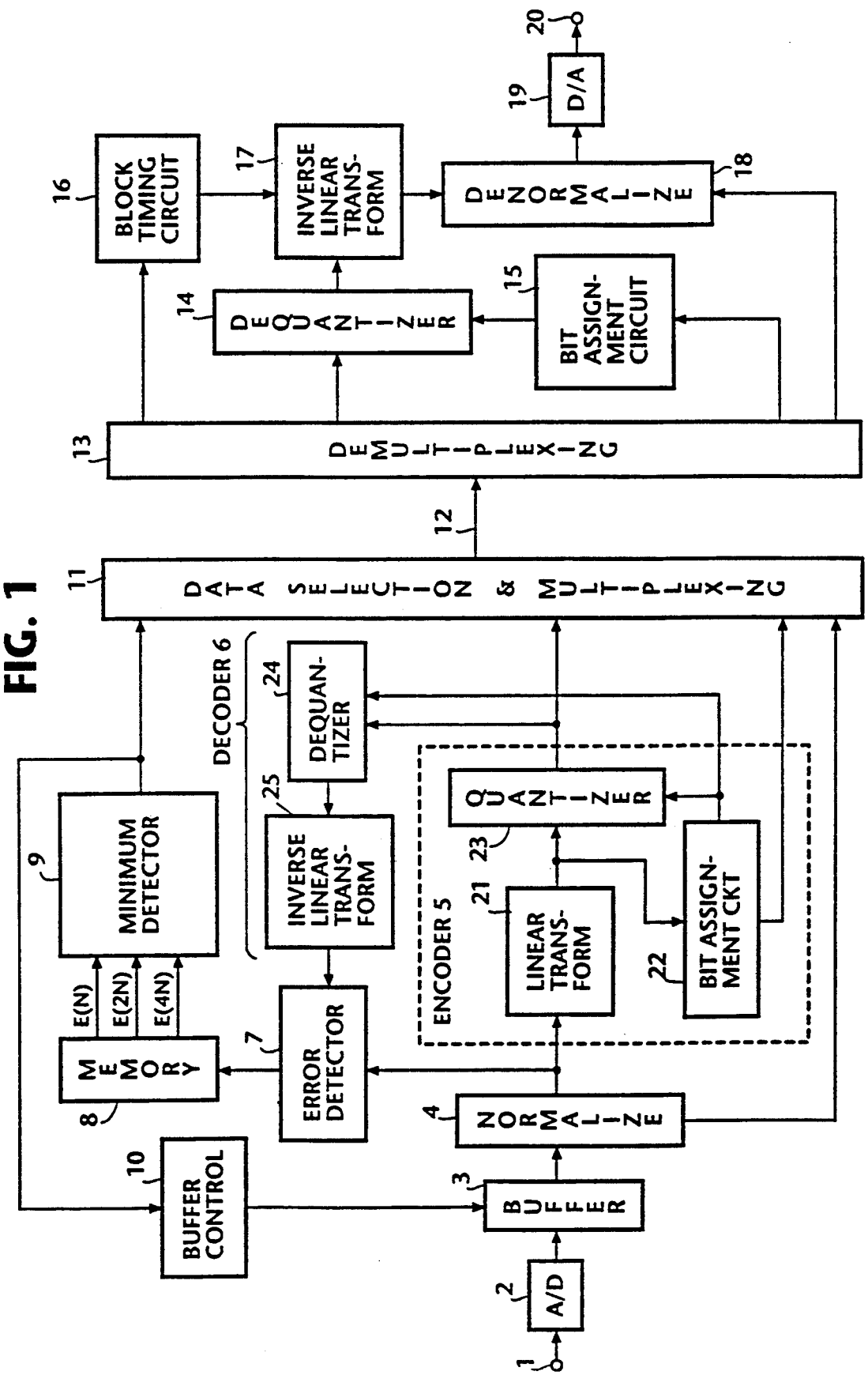
FIG. 1 is a block diagram of a digital communications system incorporating a variable block length coding/decoding scheme of the present invention.

Referring now to FIG. 1, there is shown a communications system employing an adaptive linear transform coding and decoding scheme according to the present invention. At the transmit end of the communications system, an audio-frequency signal, either speech or music, is applied to an input terminal 1. If the input signal is of analog form, it is applied to an A/D converter 2 in which it is sampled at the Nyquist rate and quantized into digital samples and fed to a buffer 3. If the input signal is of digital form it is supplied directly to the buffer. In a manner as will be fully described, a buffer controller 10 is provided to continuously write the input digital samples into buffer 3 and read stored samples of a variable block length which is a multiple of a predetermined number N of samples, i.e. N, 2N, ... $2^k N$, (where k=1, 2 ... m).

According to a first embodiment of this invention, each successive group of 4N input samples is sequentially divided into blocks of N, 2N and 4N output samples with a total of 7N samples in a manner as will be described.

The output of buffer 3 is preferably passed through a normalizer 4 to an encoder 5 whose output is coupled to a decoder 6 for error detection and minimum error detection on the one hand, and to a data selection and multiplexing circuit 11 for transmission on the other. The output of decoder 6 is coupled to an error detector 7 to which the output of normalizer 4 is also applied. Error detector 7 squares the values of every N samples (=subblock) of each block from decoder 6 to produce a squared value $S_q^2$ and squares the values of a corresponding N subblock from normalizer 4 to produce a squared value $S_i^2$ and divides the latter with a difference $S_i^2 - S_q^2$. Therefore, seven error values are derived from the first, N-sample block, the second, 2N-sample block and the third, 4N-sample block and stored in respective locations of a memory 8. A minimum detector 9 takes its inputs from memory 8 to receive a first error value E(N) derived from the first N-sample block, a second error value E(2N) derived from the first subblock of the second 2N-sample block as a representative value of that block, and a third error value E(4N) derived from the first subblock of the third 4N-sample block as its representative value. Minimum error detector 9 searches the input error values and detects which one of these is of the least value and identifies the block of least error as a block of optimum length. This optimum length block is identified as a block in which a characteristic change in factors such as amplitude, phase and frequency has occurred.

The output of minimum error detector 9 is coupled to the data selection and multiplexing circuit 11 to transmit a signal representative of the optimum block length as supplementary information. This signal is further applied to buffer controller 10 to cause it to shift the contents of buffer 3 to discard samples corresponding in number to the samples contained in the block identified as an optimum block length.

Encoder 5 comprises a linear transform coding circuit 21, a bit assignment circuit 22, and a quantizer 23. According to the first embodiment of this invention, linear transform coding circuit 21 provides linear transform coding on each variable-length block of samples from the output of normalizer 4 at variable intervals corresponding to the length of each block to generate a series of $2^0 N$, $2^1 N$ ... $2^m N$ transform coefficients. The Walsh-Hadamard transform, the discrete Fourier transform, the discrete cosine transform and the Karhunen-Loéve transform are suitable linear transform coding for this invention. Quantizer 23 is connected to the output of linear transform coding circuit 22. Quantizer 23 includes a maximum of $2^m N$ quantizer elements for successively quantizing the $2^0 N$, $2^1 N$, ... $2^m N$ transform coefficients using an optimum number of bits supplied from bit assignment circuit 21 whose function is to minimize squared errors resulting from quantization and dequantization processes.

FIG. 2 shows details of bit assignment circuit 22 as comprising a square-and-average circuit 30 in which squared values of the transform coefficients are derived from each variable-length block supplied from linear transform circuit 21, and an average value of neighboring M squared samples (where M is a divisor of N) is taken from each variable-length block as a representative value of the M samples. From each N squared samples L (=N/M) samples are therefore derived and supplied to a quantizer 31 in which they are quantized and fed to the data selection and multiplexing circuit 11 and transmitted as supplementary information. On the other hand, the output of quantizer 31 is dequantized by a dequantizer 32 and fed to an interpolator 33 in which the logarithm to the base 2 is taken of the dequantized samples and (M−1) interpolations are provided between successive input samples. The output of interpolator 33 is fed to a step-size optimizer 34 in which the following Equation is calculated:

$$R_i = \bar{R} + \frac{1}{2} \log_2 \sigma_i^2 - \frac{1}{2N} \sum_{n=1}^{N} \log_2 \sigma_n^2 \quad (1)$$

where, $R_i$ is the number of bits assigned to ith transform coefficient, $\bar{R}$ is the average number of bits assigned to each transform coefficient, and $\sigma_i^2$ is a squared value of the ith interpolated transform coefficient.

The output of quantizer 22 is supplied to multiplexing circuit 11 and transmitted as main information on the one hand, and supplied on the other to a dequantizer 24 which forms part of decoder 6. Dequantizer 24 is also supplied with the interpolated output of bit assignment circuit 21 to perform a process inverse to that of quantizer 23. The output of dequantizer 24 is fed to an inverse linear transform coder 25 to generate a replica of the samples corresponding to those appearing at the output of normalizer 4. It is seen that all processes performed by encoder 5 and decoder 6 on each block of samples must be completed before the next block of samples is supplied from buffer 3.

The effect of normalizer 4 is to cause linear transform coder 21 to produce an output whose value is not dependent on the power level of the input signal. As shown in FIG. 3, normalizer 4 comprises a buffer 40, a variance calculator 41 and a scaling circuit 42. Each variable-length block of samples is stored into buffer 40 and the variance of the samples is derived to produce a signal representative of an average power of each block. The output of variance calculator 41 is supplied to the multiplexer 11 and transmitted as supplementary information on the one hand, and used on the other by scaler 42 to modify the values of the stored samples before being applied to linear transform coder 21.

Description of details of buffer controller 10 according to the first embodiment of the invention will now be given below with reference to FIGS. 4 to 7.

Figure 4:
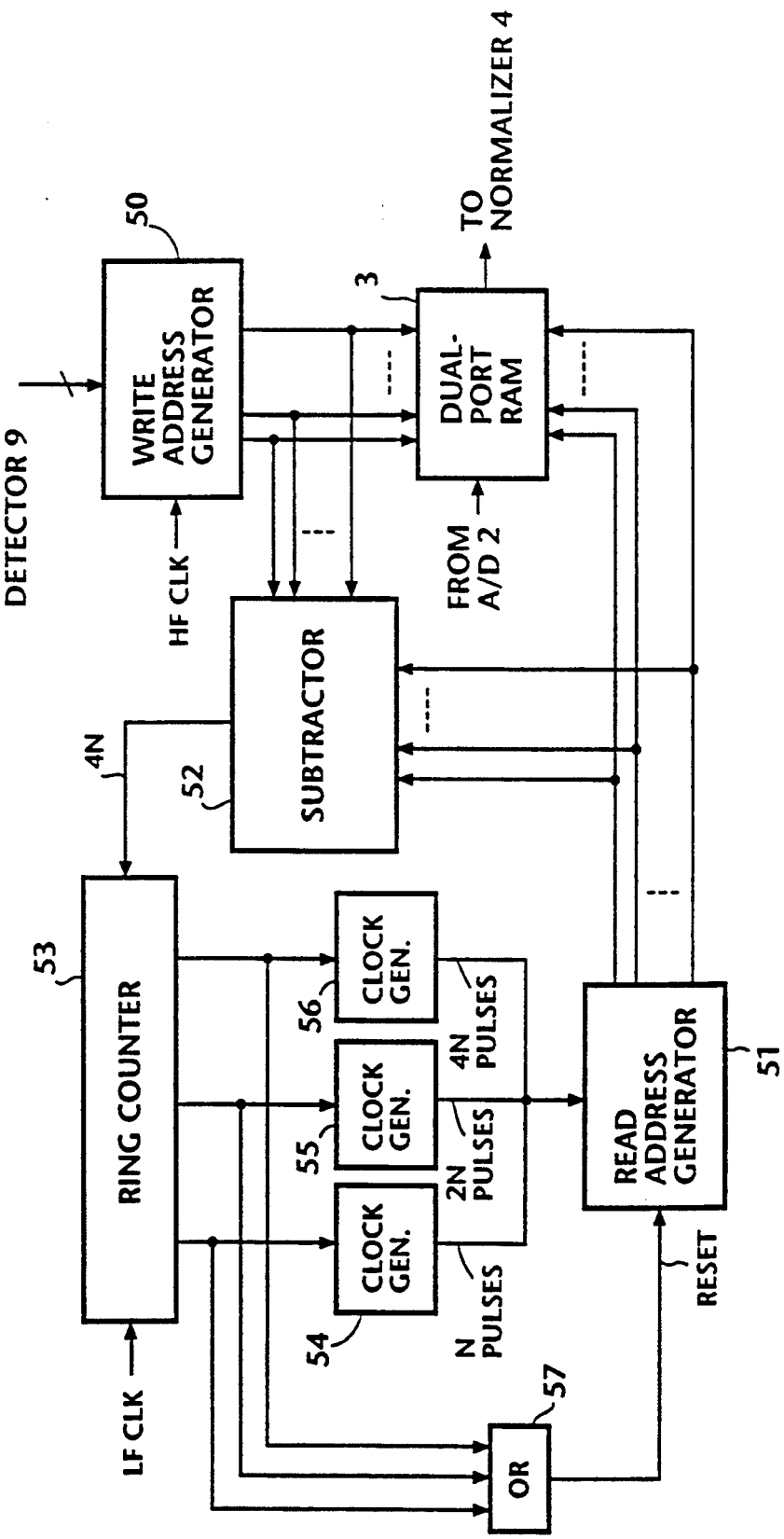
FIG. 4 is a block diagram of the buffer controller of FIG. 1 according to a first embodiment of this invention.

In FIG. 4, buffer controller 10 includes a write address generator 50 which generates a write address by counting a high-frequency clock and sequentially writes input samples from A/D converter 2 into buffer 3 which is shown as a dual-port random access memory. The stored samples are retrieved from RAM 3 by a read address generator 51 simultaneously with the write operation. The amount of samples remaining in RAM 3 is represented by the difference between the write and read address values, this difference being detected by a subtractor 52. When the stored samples reach a count 4N (assuming that the integer m is 2, and so the maximum length of block is 4N), a ring counter 53 is enabled by subtractor 52 to start counting low-frequency clock and sequentially applies an output pulse to high-frequency clock generators 54, 55 and 56 as well as to an OR gate 57. Clock generators 54, 55 and 56 generate different numbers of high-frequency pulses in burst form so that N clock pulses are supplied from clock generator 54 to the count input of read address generator 51 in response to a first ring counter output, 2N clock pulses are supplied from clock generator 55 in response to a second ring counter output and 4N clock pulses are supplied from clock generator 56 in response to a third ring counter output. The output of OR gate 57 is supplied to the reset input of read address generator 51 so that when it is reset its address increments from a zero count corresponding to the first storage location of RAM 3.

Write address generator 50 responds to the output of minimum error detector 9 as a shift command signal by shifting the storage locations of RAM 3 by an amount equal to the optimum block length so that the same number of samples as those contained in the optimum block length are discarded from RAM 3 and newer samples fill in their places each time an optimum block length decision is made.

Figure 5:
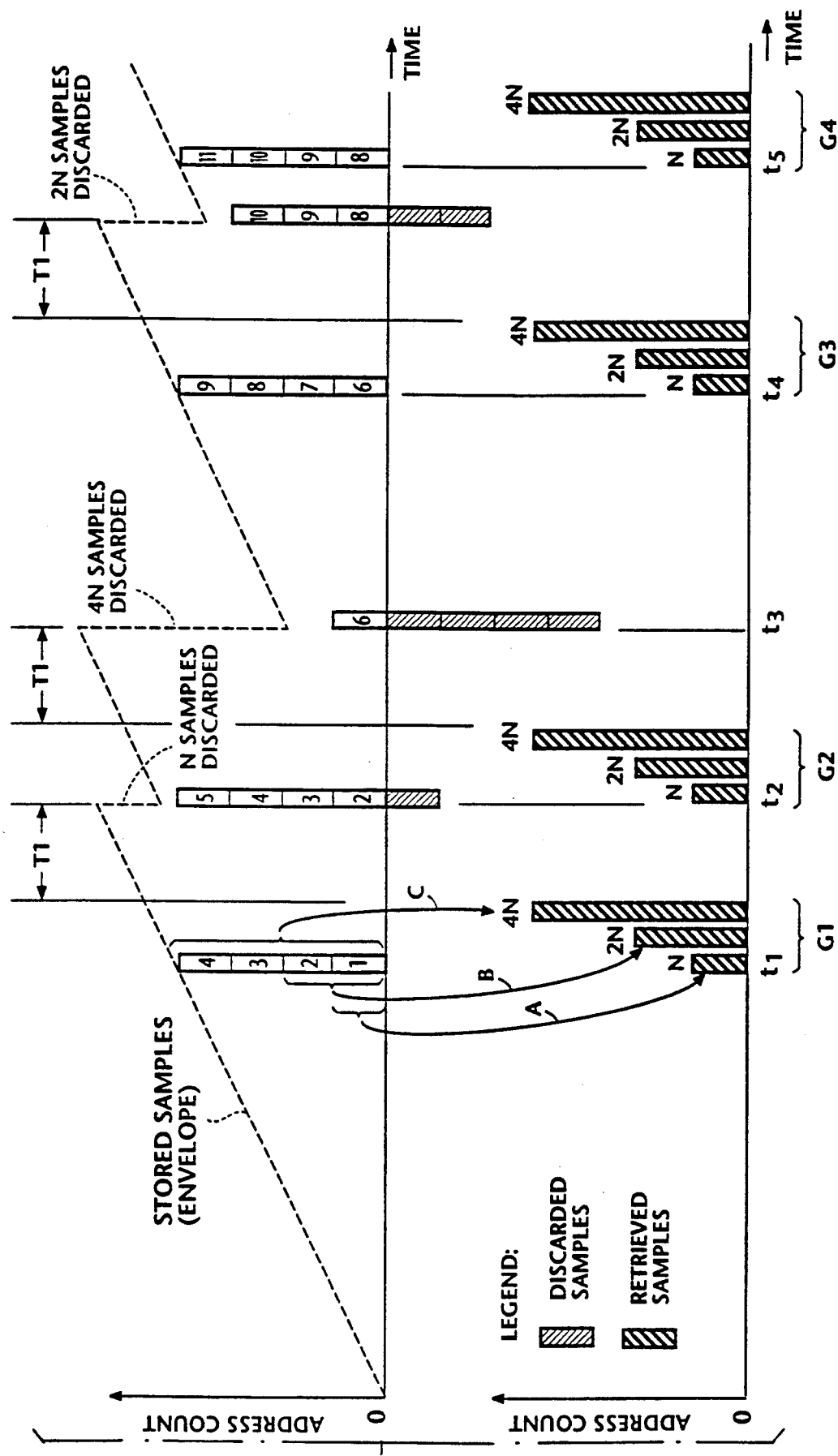
FIG. 5 is a timing diagram for describing the operation of FIG. 4.

The operation of buffer controller of FIG. 4 will be understood with reference to FIG. 5. It is assumed that the minimum error detector 9 sequentially determines that block lengths N, 4N and 2N are sequentially optimum for a sequence of three groups of N, 2N and 4N output samples each (with a total of 21N output samples) when a sequence of 9N input samples are stored into RAM 3. When 4N samples are initially stored into RAM 3 at time $t_1$, subtractor 52 generates an output to cause ring counter 53 to enable clock generator 54 to supply N clock pulses to the read address generator 51, thus reading N samples from the first to the Nth sample storage locations of RAM 3 as indicated by an arrow A and fed to normalizer 4 as a first block of group G1. Subsequently, clock generator 55 is enabled by ring counter 53 to supply 2N pulses to address generator 51 to cause it to read 2N samples (first and second blocks) from the first to the 2Nth sample storage locations of RAM 3 as indicated by an arrow B and fed to normalizer 4 as a second block of group G1. Clock generator 56 is then enabled to supply 4N pulses to address generator 51 to read 4N samples (first to fourth blocks) from the first to the 4Nth sample storage locations of RAM 3 as indicated by an arrow C and fed to the normalizer as a third block of group G1.

Coding/decoding and error computations are successively performed on each of these N, 2N and 4N samples of group G1. If these processes are completed within a period T1 from the time of delivery of the third block of group G1, a decision will be made by minimum error detector 9 at time $t_2$ on the group G1 samples in favor of N block length. N samples will be discarded and the remaining 3N samples (second to fourth blocks) are shifted to the first to 3Nth storage locations and new N samples (fifth block) are added, causing subtractor 52 to supply the next output pulse to ring counter 53. In this way, a series of similar events occurs with respect to the 4N samples (second to fifth blocks) remaining in RAM 3 at time $t_2$, producing a second group G2 of output samples and a second decision being made by detector 9 on group G2 at time $t_3$ in favor of 4N optimum block length. Thus, 4N samples are discarded from RAM 3, leaving new N samples (sixth block) in RAM 3. New 3N samples (seventh to ninth blocks) are then stored into the memory resulting in a total of 4N samples at time $t_4$. Subtractor 52 thus generates an output, causing a group G3 of output samples to be read out of RAM 3. At the end of a T1-interval following the delivery of G3 group output samples from RAM 3, a third decision is made by minimum error detector 9 in favor of 2N block length at time $t_5$, causing RAM 3 to discard 2N samples, leaving eighth and ninth samples to which tenth N samples are newly added. A group G4 of output samples is then read out of RAM 3 when new eleventh N samples are subsequently written into RAM 3.

Figure 6:
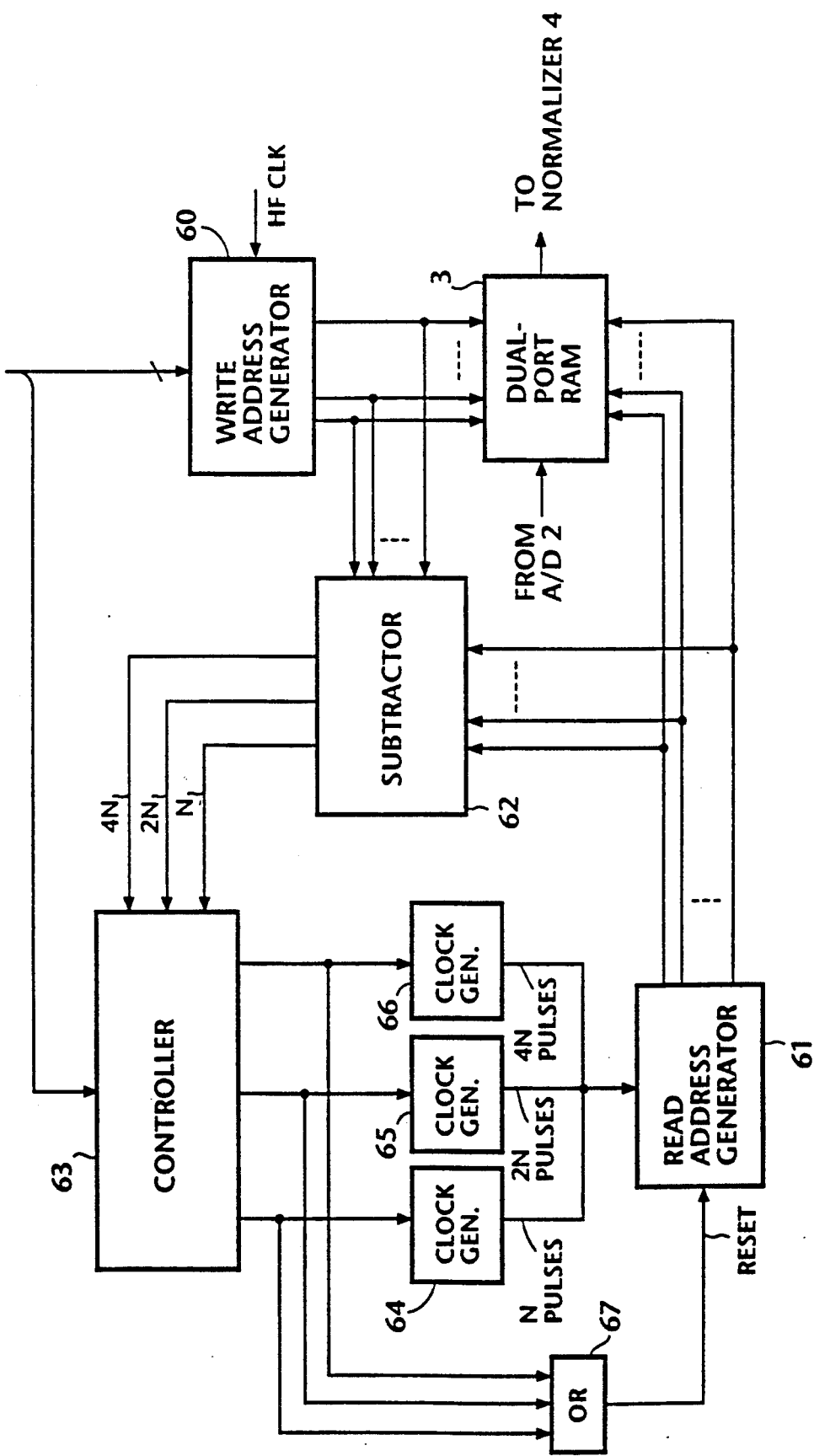
FIG. 6 is a block diagram of a preferred form of the buffer controller.

A modified form of the buffer controller 10 is shown in FIG. 6. In this modification, buffer controller 10 includes a write address generator 60 which generates a write address to sequentially write input samples into buffer 3 as in FIG. 4. Similarly, the amount of samples remaining in RAM 3 is detected by a subtractor 62 by comparison between the write address supplied from read address generator 60 and a read address generated by a read address generator 61. Subtractor 62 generates first, second and third output signals respectively when the stored samples successively reach a count N, 2N and 4N. A controller 63 is provided to receive the outputs of subtractor 62 as well as a shift command signal from detector 9 to enable clock generators 64, 65 and 66 in succession. The outputs of controller 63 are fed to an OR gate 67 to reset the read address generator 61 in the same manner as in FIG. 4.

The operation of buffer controller of FIG. 6 will be understood with reference to FIG. 7. As in FIG. 5, it is assumed that the minimum error detector 9 sequentially determines that block lengths N, 4N and 2N are sequentially optimum for a sequence three groups of N, 2N and 4N samples in response to a sequence of 9N input samples. When samples in RAM 3 reach count N at time $t_1$, controller 63 enables clock generator 64 to supply N clock pulses to the read address generator 61 to cause it to read N samples from the first to the Nth storage locations of RAM 3 for application to normalizer 4. At time $t_2$, the stored samples reach count 2N and controller 63 enables clock generator 65 to supply 2N clock pulses to address generator 61 to read 2N samples out of the first to the 2Nth storage locations of RAM 3. Likewise, at time $t_3$, the stored samples reach count 4N and controller 63 enables clock generator 66 to supply 4N clock pulses to address generator 61 to read 4N samples out of the first to the 4Nth storage locations of RAM 3.

In this way, N, 2N and 4N samples are successively delivered from RAM 3 as a corresponding number of input samples is successively stored in RAM 3. Each time the first and second blocks of samples are read out of RAM 3, coding/decoding processes and error calculation are performed and errors derived from these samples are stored in memory 8 before the third block of output samples are read out of RAM 3. When the following 4N samples are read out of memory 3, coding/decoding processes and error calculations are performed on the third block of samples within a period T2 which is obviously smaller than T1 and a decision in favor of N block length is then made by minimum error detector 9 at the end of period T2 on the whole blocks of group G1, causing the first N samples to be discarded from the memory at time $t_4$, leaving second to fourth N samples in RAM 3.

Since 3N samples remain in RAM 3 at time $t_4$, subtractor 62 will generate an output (2N), causing controller 63 to successively enable clock generators 64 and 65 so that N samples are read out of the first to Nth storage locations of RAM 3 as indicated by arrow a and delivered as a first block of group G2, and then 2N samples are read out of the first to 2Nth storage locations of RAM 3 as indicated by arrow b and delivered as a second block of group G2. At time $t_5$, new N samples (fifth block) will be stored in RAM 3 giving a total of 4N samples. Subtractor 62 supplies an output (4N) to controller 63 to read 4N samples (second to fifth blocks) as a third block of group G2.

Since all blocks of group G2 are closely spaced apart from each other, the decision in favor of 4N block length will be made by minimum error detector 9 at time $t_6$, i.e., at the end of a period T1' which may be approximately equal to period T1. The second to fifth samples will then be discarded, and sixth N new samples will be stored. Subtractor 62 produces an output (N) to read the sixth N samples as N samples of group G3. At time $t_7$, seventh N samples are added to the sixth N samples, and subtractor 62 generates an output (2N) to read the sixth and seventh N samples as 2N samples of G3. At time $t_8$, eighth and ninth N samples will be stored in RAM 3 giving a total of 4N samples. Subtractor 62 generates an output (4N) to read the sixth to ninth N samples of group G3. At time $t_9$, a minimum error decision will be taken in favor of 2N block length to discard the sixth and seventh samples, leaving the eighth and ninth samples. Subtractor 62 generates an output (2N) to read the eighth N samples as N samples of group G4 as indicated by arrow c and then the eighth and ninth N samples are read as 2N samples of G4 as indicated by arrow d. At time $t_{10}$, new tenth and eleventh N samples are stored, giving a total of 4N samples and these samples are read as 4N samples of G4.

As illustrated in FIG. 8, data selection and multiplexing circuit 11 includes a multiplexer 70 in which the main information signal supplied from quantizer 23 and supplementary information signals from bit assignment circuit 22 and normalizer 4 are multiplexed into a single variable-length block of data corresponding to each variable-length block of samples retrieved from buffer 3. The multiplexed blocks are successively stored into respective locations of a memory 71 and supplied to a selector 72 to which the output of minimum error detector 9 is also applied. In response to an optimum block length signal from detector 9, selector 72 reads the corresponding block out of memory 71 into a multiplexer 73 in which it is multiplexed with the optimum block length signal into a sequence of samples and transmitted over a transmission line 12 to the receiver.

In the receiver, the multiplexed signal is decomposed by a demultiplexer 13 into individual components. Quantized transform coefficients are demultiplexed and sequentially supplied to a dequantizer 14, and the signal indicating a step size value derived by bit assignment circuit 22 is demultiplexed and fed to a bit assignment circuit 15. Further, the variance signal derived by normalizer 4 is demultiplexed and fed to a denormalizer 18. As shown in FIG. 9, bit assignment circuit 15 is made up of a dequantizer 80, an interpolator 81 and a step-size optimizer 82. The demultiplexed a step-size value signal is dequantized by dequantizer 80 and fed to interpolator 81 which provides interpolations in much the same way as interpolator 33 of the tranmitter. Step-size optimizer 82 also corresponds to the step-size optimizer 34 of the transmitter to determine the optimum quantization step-size by computing Equation (1). Using the step-size determined by the optimizer 82, dequantizer 14 recovers a replica of the original transform coefficients and supplies it to an inverse linear transform coder 17 whose output is connected to denormalizer 18. The demultiplexed optimum block length signal is applied to a block timing circuit 16 in which it is converted to a block timing signal indicating the end of a received block of transform coefficients. In response to the block timing signal, inverse linear transform coder 17 performs inverse linear transform on the dequantized transform coefficients to recover a replica of the original digital speech/music samples and applies it to denormalizer 18.

The output of inverse linear transform coder 17 is processed by denormalizer 18 in a process inverse to that of normalizer 4. As shown in FIG. 10, denormalizer 18 includes a scaler 90 which multiplies the output of inverse linear transform coder 17 by a reciprocal of the demultiplexed variance signal. The output of scaler 90 is fed to a buffer 91 whose output is converted to analog form by a D/A converter 19 to produce a replica of the original analog speech/music signal at an output terminal 20.

Figure 11:
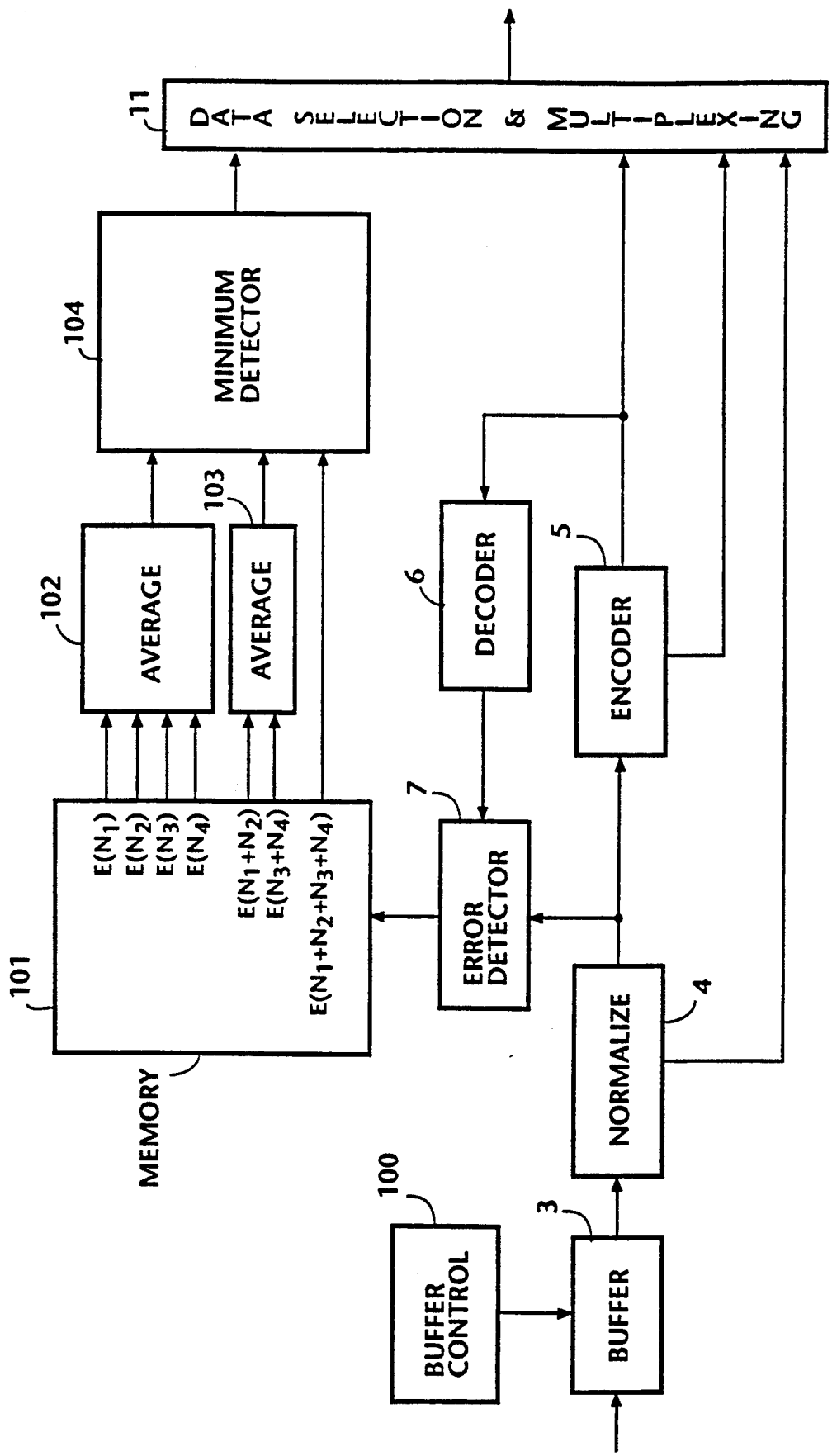
FIG. 11 is a block diagram of a second embodiment of this invention.

A second embodiment of this invention is illustrated in FIG. 11. In this embodiment, buffer 3 is controlled by a buffer controller 100 which operates independently of the output of a minimum detector 104 to read a sequence of seven variable length blocks of samples. A memory 101 is coupled to the error detector 7 to store a group of seven errors which are respectively derived from the blocks. First four outputs of memory 100 are connected to a first average circuit 102 and the fifth and sixth outputs of the memory are connected to a second average circuit 103. The outputs of average circuits 102 and 103 are coupled to minimum detector 104 to which the seventh output of memory 101 is also applied.

Figure 12:
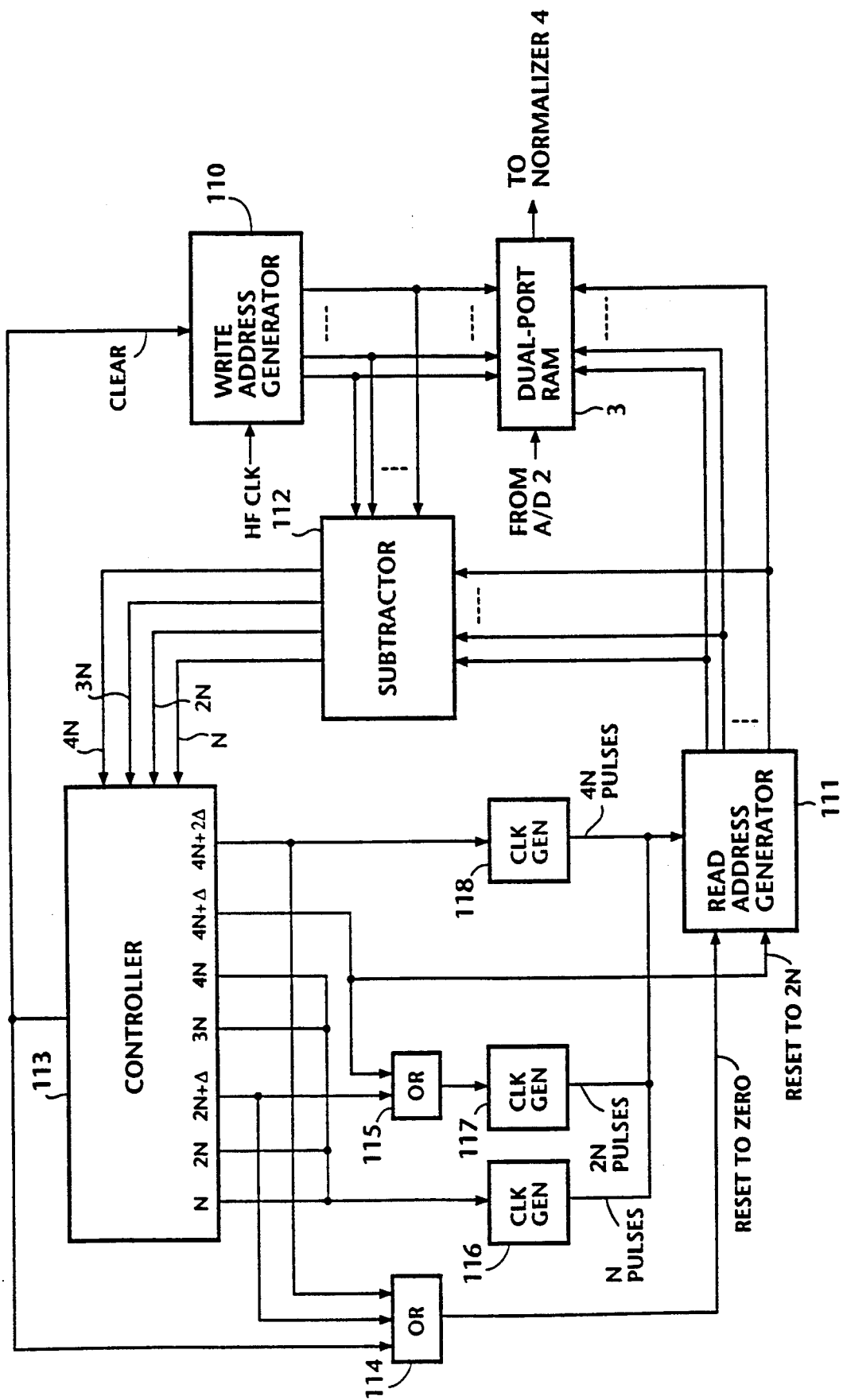
FIG. 12 is a block diagram of the buffer controller of FIG. 11.

In FIG. 12, details of buffer controller 100 are illustrated. Each successive group of 4N input samples stored in buffer 3 is sequentially divided into seven blocks of N, N, 2N, N, N, 2N and 4N output samples, a total of 12N output samples. Write and read address generators 110 and 111 are provided as in the first embodiment of this invention. Subtractor 112 detects the amount of samples stored in RAM 3 by making a comparison between the write and read addresses as in the previous embodiments. In this embodiment, subtractor 112 generates four output signals (N), (2N), (3N) and (4N) when the stored sample count reaches N, 2N, 3N and 4N, respectively. The outputs of subtractor 112 are fed to a controller 113 having output terminals designated N, 2N, 2N+$\Delta$, 3N, 4N, 4n+$\Delta$, and 4N+2$\Delta$. The output terminals N, 2N 3N and 4N of controller 113 are coupled together to a clock generator 116 which generates N clock pulses in burst form, and the output terminals 2N+$\Delta$ and 4N+$\Delta$ are coupled through an OR gate 115 to a clock generator 107 which generates 2N clock pulses. The output terminal 4N+2$\Delta$ of controller 113 is connected to a clock generator 118 which generates 4N clock pulses. The outputs of clock generators 116, 117 and 118 are coupled to the count input of the read address generator 101. The read address generator 111 is reset to zero count in response to a signal from the output terminal 2N+$\Delta$ and 4N+2$\Delta$ which are connected through an OR gate 114. Address generator 111 is further reset to a 2N count in response to a signal from the 4N+$\Delta$ output terminal of controller 113. At periodic intervals, controller 113 supplies a clear pulse to write address generator 110 to discard all samples in RAM 3 to refill it with new input samples. This clear pulse is also applied to the read address generator 111 via OR gate 114.

The operation of buffer controller 100 will be understood with reference to FIG. 13. At time $t_0$, clear pulse is supplied to both address generators. When N input samples are stored in RAM 3 at time Nt, subtractor 112 supplies an output (N) to controller 113, which generates an output at the output terminal N. Clock generator 116 is enabled to supply N clock pulses to the read address generator 111 to read the first block of N samples from RAM 3 as a first block of output samples.

At time 2Nt, a second block of N input samples is stored into RAM 3 and subtractor 112 generates an output signal (2N). Controller 113 applies a signal to its output terminal 2N so that the read address generator 111 is incremented further by a 2N count to read the second block of N samples as a second block of output samples. Subsequently, controller 113 applies a signal to the 2N+$\Delta$ output terminal. Clock generator 117 is enabled to supply 2N clock pulses to the read address generator 111 to read first and second N samples as a third block of output samples.

At time 3Nt, third N input samples are stored into RAM 3 and subtractor 112 produces an output signal (3N). Controller 113 applies a signal to the 3N output terminal to enable clock pulse generator 106. The read address generator 111 is thus incremented by N from the previous 2N count value and the third N samples are read out of RAM 3 as a fourth block of output samples.

At time 4Nt, fourth N input samples are stored into RAM 3 and subtractor 112 produces an output signal (4N). Controller 113 applies a signal to the 4N output terminal to enable clock pulse generator 116. The read address generator 111 is thus incremented further by N from the previous 3N count value and the fourth N samples are read out of RAM 3 as a fifth block of output samples. In succession to the fifth block of output samples, controller 113 sequentially applies a signal to its 4N+$\Delta$ output terminal to cause clock generator 117 to supply 2N clock pulses to the read address generator 111 as well as to its reset-to-2N input terminal. Thus, the address generator 111 is incremented by a 2N count from the previous 2N address count to read the third and fourth N samples from RAM 3 as a sixth block of output samples. Controller 113 then applies a signal to its 4N+2$\Delta$ output terminal. This signal resets the address generator 111 to zero and causes clock generator 118 to increment the address generator 111 by a 4N count from zero. As a result, the first to fourth N samples are read out of RAM 3 as a seventh block of output samples. Controller 113 then clears the write and read address generators to repeat the above process to successively read a group of seven blocks of output samples. It is seen from FIG. 13 that each sequence of seven variable length blocks contains an equal number of groups of N (=subblock) samples of different arrivals, i.e., three subblocks of first arrivals, three subblocks of second arrivals, three subblocks of third arrivals and finally three subblocks of fourth arrivals.

Figure 14A:
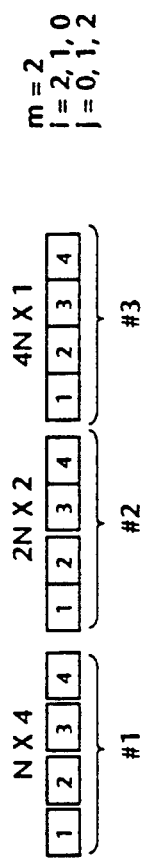
FIGS. 14A to 14C are illustrations of organized sample sequences according to the second embodiment of the present invention.

As in the first embodiment, the linear transform coder 21 and inverse linear transform coder 25 provide coding/decoding processes at variable intervals corresponding to each block of different length. After decoding process, each block undergoes an error computation process in which an error between each block at the output of inverse linear transform coder 25 and a corresponding block at the output of normalizer 4 is detected and stored into memory 8. In these encoding/decoding processes the sample sequence is treated on a block-by-block basis by the encoder 5 and decoder 6 as if it were organized into a first group of four blocks of N samples each, a second group of two blocks of 2N samples each, and a block of 4N samples as a third group as shown in FIG. 14A.

For example, in response to each sequence of 4N input samples, designated $N_1$, $N_2$, $N_3$ and $N_4$, these are treated as a first group containing four blocks $N_1$, $N_2$, $N_3$ and $N_4$ of one-subblock length, a second group of two blocks "$N_1$ and $N_2$" and "$N_3$ and $N_4$" of two-subblock length and a third group of "$N_1$, $N_2$, $N_3$ and $N_4$" of four-subblock length. Four errors $E(N_1)$, $E(N_2)$, $E(N_3)$ and $E(N_4)$ are derived respectively from the blocks of the first group and two errors $E(N_1+N_2)$ and $E(N_3+N_4)$ are derived respectively from the two blocks of the second group, and a single error $E(N_1+N_2+N_3+N_4)$ is derived from the block of the third group. These seven error values are stored in respective locations of memory 101.

Average circuit 102 takes an average value of the errors $E(N_1)$, $E(N_2)$, $E(N_3)$ and $E(N_4)$ and average circuit 103 takes an average value of the errors $E(N_1+N_2)$ and $E(N_3+N_4)$. Minimum error detector 104 compares these averaged errors and the error $E(N_1+N_2+N_3+N_4)$ against each other and detects a minimum value, and classifies those blocks of the minimum error as having an optimum block length. Data selector 72 selects the transform coefficients of the blocks having the optimum block length from memory 71 for transmission. If the optimum block length is N, transform coefficients corresponding to one-subblock length samples $N_1$, $N_2$, $N_3$ and $N_4$ are selected, and if the optimum block length is 2N, transform coefficients corresponding to two-subblock length samples "$N_1$ and $N_2$" and "$N_3$ and $N_4$" are selected. For an optimum block length 4N, those corresponding to the four-subblock length samples "$N_1+N_2+N_3+N_4$" are selected for transmission.

Figure 14B:
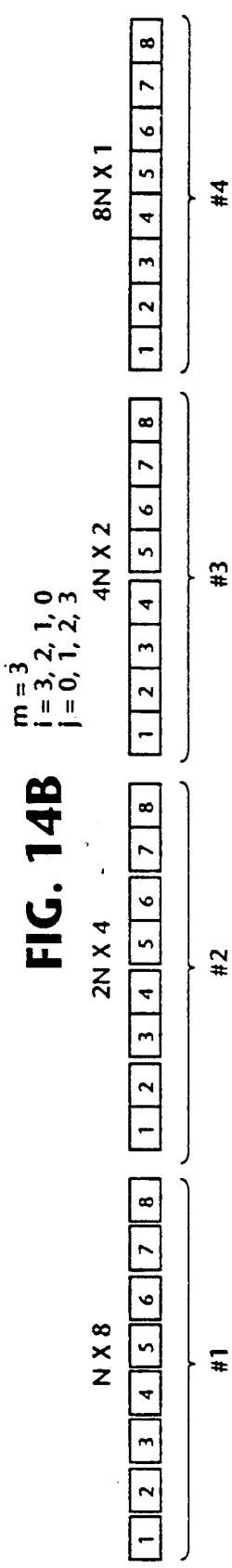
Figure 14C:
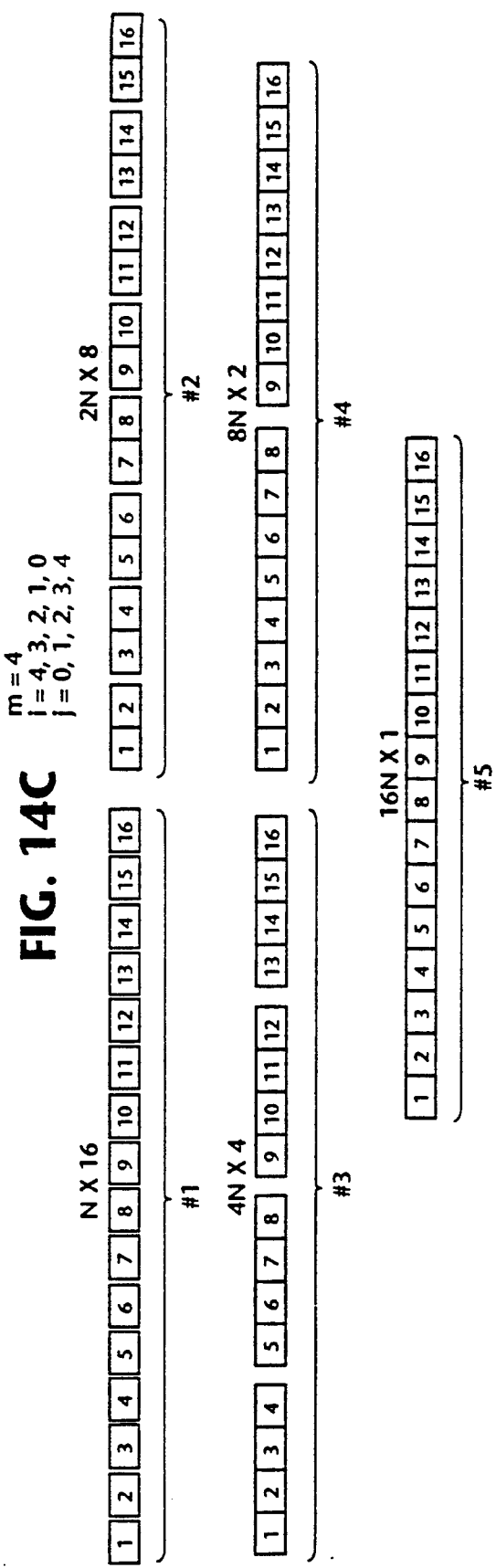

It is seen that the samples are organized into $(m+1)$ groups of $2^i$ blocks of $2^j$ N samples each, where i is a variable in a range from m to 0 and j is a variable in a range from 0 to m, and $m=i+j$. If $m=3$, the sample sequence is organized into a first group of eight blocks of N samples each, a second group of four blocks of 2N samples each, a third group of two blocks of 4N samples each, and a fourth group consisting of a block of 8N samples as illustrated in FIG. 14B. Likewise, if $m=4$, the sample sequence is organized into a first group of sixteen blocks of N samples each, a second group of eight blocks of 2N samples each, a third group of four blocks of 4N samples each, a fourth group of two blocks of 8N samples each, and a fifth group of 16N samples, as illustrated in FIG. 14C.

While mention has been made of linear transform coding, the present invention could equally be as well applied to other coding methods. In addition, the foregoing description shows only preferred embodiments of the present invention. Various modifications are apparent to those skilled in the art without departing from the scope of the present invention which is only limited by the appended claims.

What is claimed is:

1. A coding method comprising:
   a) continuously storing a sequence of input samples representing an audio-frequency signal into a buffer;
   b) successively detecting a change in characteristics of the input samples of successive groups and forming the input samples of each successive group into one or more blocks of optimum length which is variable in accordance with said detected characteristics change;
   c) encoding the samples of each successive block into coded symbols at intervals corresponding to the length of each successive block; and
   d) multiplexing the coded symbols with a signal representative of the length of each successive block into a channel.

2. A coding method as claimed in claim 1, wherein said coded symbols are linear transform coefficients.

3. A coding method as claimed in claim 1, further comprising the steps of demultiplexing said coded symbols and said length-indicative signal, and decoding the demultiplexed coded symbols at intervals corresponding to said demultiplexed length-representative signal.

4. A coding method as claimed in claim 1, further comprising the steps of deriving a variance of the samples of each successive block and scaling said samples with said variance, and multiplexing the variance with said coded symbols into said channel.

5. A coding method as claimed in claim 2, further comprising the steps of determining a step size from said linear transform coefficients and quantizing said linear transform coefficients according to said step size prior to the step (c), and multiplexing said step size with the quantized linear transform coefficients into said channel.

6. A coding method as claimed in claim 5, wherein said step size is determined by the steps of squaring said linear transform coefficients and taking an average value of a group of the squared linear transform coefficients of neighboring occurrences as a representative value of said group, multiplexing the linear transform coefficients with said average value, providing interpolations between successive ones of said squared linear transform coefficients, and deriving said step size from the interpolated squared linear transform coefficients.

7. A coding method as claimed in claim 1, wherein the step (b) comprises the steps of organizing the samples of each successive group into successive blocks of different lengths, and detecting one of said blocks of different lengths corresponding to the detected characteristics change as a block of said optimum length.

8. A coding method as claimed in claim 7, wherein each of said blocks of different lengths comprises one or more subblocks of N samples each, and wherein each of said blocks of different block lengths contain $2^k$N samples, where k is an integer variable in a range from 0 to a predetermined maximum value.

9. A coding method as claimed in claim 1, wherein the step (c) comprises reading samples stored in said buffer and organizing $2^{i+j}$ N samples read out of said buffer into $(m+1)$ groups of $2^i$ blocks of $2^j$ N samples each, where $i+j=m$, and i is a variable in a range from m to 0 and j is a variable in a range from 0 to m, and where m is equal to or greater than 2, and N is an integer, each of said groups containing an equal amount of samples of equal arrivals, and detecting one or more blocks from said $(m+1)$ groups according to the detected characteristics change as a block of said optimum length.

10. A coding method comprising:
   a) continuously storing a sequence of input samples representing an audio-frequency signal into a buffer and successively dividing the stored samples into a group of blocks of different lengths;
   b) encoding the samples of each of said blocks into coded symbols at intervals corresponding to the length of each block;
   c) decoding each block of said coded symbols into a block of samples in a process inverse to the step (b);
   d) detecting an error between each block of samples decoded by the step (c) and a corresponding block of samples divided by the step (a);
   e) repeating the steps (a) to (d) to derive a plurality of errors from each group of blocks of input samples;
   f) detecting a minimum value of said errors and identifying one of the blocks of the coded symbols encoded by the step (b) which corresponds to said minimum value as having an optimum block length; and
   g) multiplexing the coded symbols of the optimum block length with a signal indicating the optimum block length into a channel.

11. A coding method as claimed in claim 10, wherein said coded symbols are linear transform coefficients.

12. A coding method as claimed in claim 10, further comprising the steps of deriving a variance of said samples from said buffer and scaling said samples with said variance prior to the step (b), and multiplexing the variance which is derived from samples of said optimum block length with said coded symbols.

13. A coding method as claimed in claim 12, further comprising the steps of determining a step size from said linear transform coefficients and quantizing said linear transform coefficients according to said step size prior to the step (b), and multiplexing said step size with the quantized linear transform coefficients.

14. A coding method as claimed in claim 13, wherein said step size is determined by the steps of squaring said linear transform coefficients and taking an average value of a group of the squared linear transform coefficients of neighboring occurrences as a representative value of said group, multiplexing the linear transform coefficients of the optimum block length with the average value which is derived from the linear transform coefficients of said optimum block length, providing interpolations between successive ones of said squared linear transform coefficients, and deriving said step size from the interpolated squared linear transform coefficients.

15. A coding method as claimed in claim 13, further comprising the step of dequantizing the quantized linear transform coefficients according to said step size prior to the step (c).

16. A coding method as claimed in claim 10, wherein the step (a) comprises the steps of:
   a1) detecting when samples of a maximum of said different block lengths are stored in said buffer;
   a2) organizing the samples of the maximum block length detected by the step (a1) into a sequence of samples of different block lengths, wherein the length of each successive block being a multiple of the block of a minimum block length;
   a3) discarding samples of earlier arrivals from said buffer by an amount equal to the number of samples contained in said optimum block length; and
   a4) repeating the steps (a1) to (a3).

17. A coding method as claimed in claim 10, wherein the step (a) comprises the steps of:
   a1) detecting when the samples stored in said buffer successively reach thresholds of increasing values corresponding respectively to said different block lengths;
   a2) retrieving samples corresponding in number to the detected threshold from said buffer;
   a3) discarding samples of earlier arrivals from said buffer by an amount equal to the number of samples contained in said optimum block length;
   a4) detecting whether the number of samples remaining in said buffer is greater than a lowest of said thresholds or equal to the lowest threshold;
   a5) if said remaining samples are detected as being greater than said lowest threshold, successively retrieving different block lengths of the remaining samples from said buffer;
   a6) if said remaining samples are detected as being equal to said lowest threshold, retrieving said remaining samples from said buffer; and
   a7) repeating the steps (a1) to (a6).

18. A coding method as claimed in claim 10, wherein the step (a) comprises reading samples stored in said buffer and organizing $2^{i+j}N$ samples read out of said buffer into (m+1) groups of $2^i$ blocks of $2^jN$ samples each, where $i+j=m$, and i is a variable in a range from m to 0 and j is a variable in a range from 0 to m, and where m is equal to or greater than 2, and N is an integer, each of said groups containing an equal amount of samples of equal arrivals.

19. A coding method as claimed in claim 18, wherein the step (a) comprises the steps of:
   a1) detecting when samples in said buffer successively reach thresholds of increasing values corresponding respectively to an integral multiple of a subblock which equally divides each block;
   a2) dividing the samples in said buffer upon detection by the step (a1) into $2^jN$ samples and retrieving each of the divided N samples from said buffer;
   a3) repeating the steps (a1) and (a2) until $2^{i+j}N$ samples are stored in said buffer to produce a sequence of output samples so that said output samples contains (m+1) groups of $2^i$ blocks of $2^jN$ samples;
   a4) clearing the contents of said buffer when said sequence of output samples is retrieved from said buffer; and
   a5) repeating the steps (a1) to (a4).

20. A coding method as claimed in claim 18, wherein the step (d) comprises:
   d1) detecting an error from each block of m of said (m+1) groups by excluding a group which contains one block of $2^mN$ samples to produce m average errors; and
   d2) detecting a minimum of errors from said m average errors and the error derived from said excluded group.

21. A coding method as claimed in claim 10, further comprising the steps of receiving a multiplexed signal through said channel, demultiplexing the multiplexed signal into said coded symbols and said optimum length signal, and decoding said demultiplexed coded symbols at intervals corresponding to said optimum length signal.

22. A communications system comprising:
   a buffer;
   buffer control means for continuously storing a sequence of input samples representing an audio-frequency signal into said buffer;
   optimum length determination means for successively detecting a change in characteristics of the stored input samples of successive groups and forming the input samples of each successive group into one or more blocks of optimum length which is variable in accordance with said detected characteristics change;
   encoder means for encoding the samples of each successive block into coded symbols at intervals corresponding to the length of each successive block;
   multiplexer means for multiplexing the coded symbols with a signal representative of the length of each successive block into a channel;
   demultiplexer means for receiving a multiplexed signal through said channel and decomposing the multiplexed signal into said coded symbols and said length-representative signal; and
   decoder means coupled to said demultiplexer means for decoding said demultiplexed coded symbols at intervals corresponding to the length indicated by the demultiplexed length-representative signal.

23. A communications system as claimed in claim 22, wherein said coded symbols are linear transform coefficients.

24. A communications system as claimed in claim 22, further comprising means for deriving a variance of the samples of each successive block and scaling said samples with said variance, and causing said multiplexer means to multiplex the variance with said coded symbols into said channel.

25. A communications system as claimed in claim 23, further comprising means for determining a step size from said linear transform coefficients and means quantizing said linear transform coefficients according to said step size and causing said multiplexer means to multiplex said step size with the quantized linear transform coefficients into said channel.

26. A communications system as claimed in claim 25, further comprising means for squaring said linear transform coefficients and taking an average value of a group of the squared linear transform coefficients of neighboring occurrences as a representative value of said group, causing said multiplexer means to multiplex the linear transform coefficients with said average value, providing interpolations between successive ones of said squared linear transform coefficients, and deriving said step size from the interpolated squared linear transform coefficients.

27. A communications system as claimed in claim 1, wherein said optimum length determination means comprises means for organizing the samples of each successive groups into successive blocks of different lengths, and detecting one of said blocks of different lengths corresponding to the detected characteristics change as a block of said optimum length.

28. A communications system as claimed in claim 27, wherein each of said blocks of different lengths comprises one or more subblocks, and wherein said blocks of different block lengths contain $2^k N$ samples, where k is an integer variable in a range from 0 to a predetermined maximum value and N is an integer representing the number of samples contained in each of said subblocks.

29. A communications system as claimed in claim 1, wherein optimum length determination means comprises means for reading samples stored in said buffer and organizing $2^{i+j}N$ samples read out of said buffer into (m+1) groups of $2^i$ blocks of $2^jN$ samples each, where i+j=m, and i is a variable in a range from m to 0 and j is a variable in a range from 0 to m, and where m is equal to or greater than 2, and N is an integer, each of said groups containing an equal amount of samples of equal arrivals, and detecting one or more blocks from said (m+1) groups according to the detected characteristics change as a block of said optimum length.

30. A communications system comprising:
a buffer;
buffer control means for storing audio-frequency digital samples into said buffer and reading the stored samples from said buffer to produce a sequence of blocks of samples, said blocks having different block lengths;
encoder means for encoding the samples of each of said blocks into coded symbols at intervals corresponding to the length of each block;
first decoder means coupled to said encoder means for decoding said coded symbols into decoded samples in a process inverse to said encoder means;
error detector means for detecting an error between each block of the decoded samples from said decoder means and a corresponding block of samples from said buffer;
a memory for storing errors detected by said error detector means from said sequence of blocks of samples;
minimum detector means for detecting a minimum value of errors in said memory and generating a signal identifying one of the blocks of the coded symbols which corresponds to said minimum value as having an optimum block length;
multiplexer means for multiplexing the coded symbols of the optimum block length with said optimum length signal into a channel;
demultiplexer means for receiving a multiplexed signal through said channel and decomposing the multiplexed signal into said coded symbols and said optimum length signal; and
second decoder means coupled to said demultiplexer means for decoding said demultiplexed coded symbols at intervals corresponding to the optimum length indicated by the demultiplexed optimum length signal.

31. A communications system as claimed in claim 30, wherein said encoder means comprises a linear transform coder and each of said first and second decoder means comprises an inverse linear transform coder.

32. A communications system as claimed in claim 30, wherein the buffer control means comprises:
detector means for detecting when samples of a maximum of said different block lengths are stored in said buffer; and
means for organizing the samples of the maximum block length detected by the detector means into a sequence of samples of different block lengths such that the length of each successive is a multiple of the block of a minimum block length, and discarding samples of earlier arrivals from said buffer by an amount equal to the number of samples contained in said optimum block length.

33. A communications system as claimed in claim 30, wherein the buffer control means comprises:
detector means for detecting when the samples stored in said buffer successively reach thresholds of increasing values corresponding respectively to said different block lengths;
means for retrieving samples from said buffer in number corresponding to the detected threshold and discarding samples from said buffer by an amount equal to the number of samples contained in said optimum block length;
control means for detecting whether the number of samples remaining in said buffer is greater than a lowest of said thresholds or equal to the lowest threshold; and
means for successively retrieving the remaining samples of different block lengths from said buffer if said remaining samples are detected as being greater than said lowest threshold, and retrieving the remaining samples from said buffer if said remaining samples are detected as being equal to said lowest threshold.

34. A communication system as claimed in claim 30, wherein the buffer control means comprises means for reading samples stored in said buffer so that $2^{i+j}N$ samples read out of the buffer are organized into (m+1) groups of $2^i$ blocks of $2^jN$ samples each, where i+j=m, and i is a variable in a range from m to 0 and j is a variable in a range from 0 to m, and where m is equal to or greater than 2, and N is an integer, each of said groups containing an equal amount of samples of equal arrivals.

35. A communications system as claimed in claim 34, wherein the buffer control means comprises:

means for detecting when samples in said buffer successively reach thresholds of increasing values corresponding respectively to an integral multiple of a subblock which equally divides each block;

means for dividing samples in said buffer upon detection by the step (a1) into $2^jN$ samples and retrieving each of the divided N samples from said buffer until $2^{i+j}N$ samples are stored in said buffer to form a sequence of samples comprising (m+1) groups of $2^i$ blocks of $2^jN$ samples each.

36. A communications as claimed in claim 34, wherein said error detector means generates an error from each of said blocks of said (m+1) groups, further comprising means for deriving an average value of the errors derived from m of said (m+1) groups to produce m average errors by excluding a group which contains one block of $2^mN$ samples, wherein said minimum detector means detects a minimum of errors from said m average errors and the error derived from said excluded group.

37. A communications system as claimed in claim 30, further comprising means for generating a signal representative of a variance of samples supplied from said buffer and scaling said samples with said variance signal and applying the scaled samples to said encoder means and to said error detector means.

38. A communications system as claimed in claim 30, further comprising:
 means for deriving a quantization step size from said linear transform coefficients and generating a signal representative of the step size;
 quantizer means for quantizing said linear transform coefficients according to said quantization step size and dequantizer means; and
 dequantizer means for dequantizing said quantized linear transform coefficients according to said quantization step size and applying the dequantized linear transform coefficients to said first decoder means, wherein said multiplexer means multiplexes said step-size representative signal with the quantized linear transform coefficients.

39. A communications system as claimed in claim 37, wherein said step size is determined by a bit assignment circuit which squares said linear transform coefficients, takes an average value of a group of the squared linear transform coefficients of neighboring occurrences as a representative value of said group, and provides interpolations between successive ones of said squared linear transform coefficients, and derives said step size from the interpolated squared linear transform coefficients, wherein said multiplexer means multiplexes the linear transform coefficients of the optimum block length with a signal representative of the average value which is derived from the linear transform coefficients of said optimum block length.

40. A communications system as claimed in claim 37, further comprising quantizer means for dequantizing the quantized linear transform coefficients according to said step size and applying the dequantized transform coefficients to said first decoder means.

41. A communications system as claimed in claim 36, wherein said demultiplexer means derives said variance signal from said channel, further comprising means for scaling samples decoded by said second decoder means inversely as a function of said variance signal derived by the demultiplexer means.

42. A communications system as claimed in claim 37, wherein said demultiplexer means derives said average signal from said channel, further comprising:
 interpolator means for providing interpolations between successive ones of said average signal derived by said demultiplexer means;
 means for deriving an optimum step size from an output signal of said interpolator means; and
 second dequantizer means coupled to said demultiplexer means for dequantizing said demultiplexed quantized linear transform coefficients according to said optimum step size.

* * * * *